(12) United States Patent
Stoller et al.

(10) Patent No.: US 11,348,650 B2
(45) Date of Patent: May 31, 2022

(54) DESTRUCTION OF DATA AND VERIFICATION OF DATA DESTRUCTION ON A MEMORY DEVICE

(71) Applicant: Micron Technology, Inc., Boise, ID (US)

(72) Inventors: Scott Anthony Stoller, Boise, ID (US); Kevin R Brandt, Boise, ID (US); Qisong Lin, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 16/928,799

(22) Filed: Jul. 14, 2020

(65) Prior Publication Data

US 2022/0020439 A1    Jan. 20, 2022

(51) Int. Cl.
*G11C 16/34* (2006.01)
*G11C 16/26* (2006.01)
*G11C 16/16* (2006.01)

(52) U.S. Cl.
CPC ............ *G11C 16/349* (2013.01); *G11C 16/16* (2013.01); *G11C 16/26* (2013.01); *G11C 16/3404* (2013.01); *G11C 16/3477* (2013.01)

(58) Field of Classification Search
CPC ..... G11C 16/0483; G11C 16/16; G11C 16/26; G11C 16/3477; G11C 16/3404
See application file for complete search history.

(56) References Cited

U.S. PATENT DOCUMENTS

| | | | | |
|---|---|---|---|---|
| 8,296,508 B1* | 10/2012 | Zanardi | ................. | G11C 16/22 711/103 |
| 2006/0044899 A1* | 3/2006 | Ellis | ....................... | G11C 16/22 365/201 |
| 2018/0342301 A1* | 11/2018 | Shen | ..................... | G11C 16/16 |

* cited by examiner

*Primary Examiner* — Alfredo Bermudez Lozada
(74) *Attorney, Agent, or Firm* — Schwegman Lundberg & Woessner, P.A.

(57) ABSTRACT

A failed erase operation is detected at a memory block of a memory device. Based on detecting the failed erase operation at the memory block, data on the memory block is destroyed using a data destruction algorithm that corrupts data stored by one or more cells of the block. The data on the memory block is verified to be destroyed. A passing data destruction status for the memory block is provided based on verifying the data on the memory block is destroyed.

20 Claims, 7 Drawing Sheets

DESTRUCTION OF DATA AND VERIFICATION OF DATA DESTRUCTION ON A MEMORY DEVICE

TECHNICAL FIELD

Embodiments of the disclosure relate generally to memory sub-systems and, more specifically, to destruction of data and verification of data destruction in a memory device.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
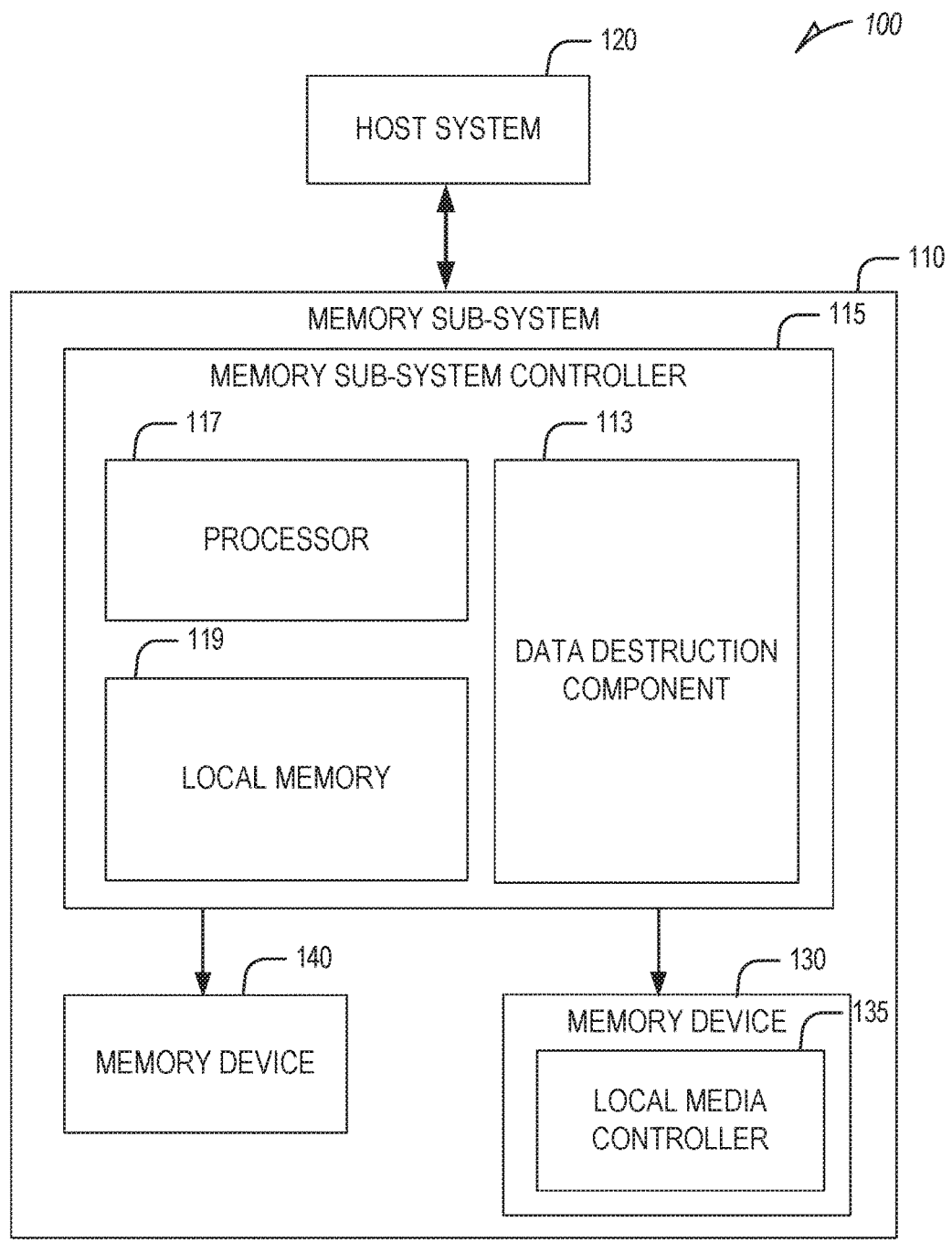
FIG. 1 illustrates an example computing system that includes a memory sub-system, in accordance with some embodiments of the present disclosure.

Aspects of the present disclosure are directed to data destruction and verification of data destruction on a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

Some memory device (e.g., NAND memory devices) include an array of memory cells (e.g., flash cells) to store data. Each cell includes a transistor and within each cell, data is stored as the threshold voltage of the transistor, based on the logical value of the cell (e.g., 0 or 1). During a read operation, a read reference voltage is applied to the transistor, and if the read reference voltage is higher than the threshold voltage of the cell, the transistor is programmed and is recognized by a memory sub-system as a binary value of 0. Memory cells in these devices can be grouped as pages that can refer to a logical unit of the memory device used to store data. With some types of memory devices (e.g., NAND), pages are grouped to form blocks (also referred to herein as "memory blocks").

An erase command can be issued to a memory device to erase and destroy user data on the device. Typically, an erase algorithm erases all data on a block of the memory device in response to the command and the device returns an erase status that indicates whether the data was successfully erased. When blocks function properly, data is erased, and the data is verified to be erased. In some instances, a device returns a failed erase status to indicate that data stored on a memory block was not successfully erased (e.g., due to a device defect). In these instances, the device may indicate a failed erase status because an erase verify algorithm could not verify that all data in the block was erased. As an example, a page in a block of a NAND device can remain programmed with readable data after a failing block erase operation because of a defect in the block. As a result, data on the device that was intended to be erased can nevertheless be recovered.

Aspects of the present disclosure address recoverable data on memory device blocks with a failed erase status by destroying all data on the blocks and verifying that all data is destroyed. Blocks with a failed erase status are also referred to herein as "failing memory blocks" or more simply as "failing blocks". In the context of the present disclosure, the terms "data destruction" and "destroying data" refer to corrupting data to render it unrecoverable. Accordingly, to destroy data on a failing memory block of a memory device, a data destruction component corrupts the data in the memory block. The data destruction component corrupts the data by using a programming signal (e.g., a pulse) with an intensified voltage to program memory cells in the memory block. The programming signal causes the threshold voltage to exceed a maximum readable threshold voltage for the block. The maximum readable threshold voltage corresponds to the highest threshold voltage of cells in the block from which it is recognizable that the memory cells are programmed with data.

The data destruction component is further responsible for verifying that the data of a failing block is destroyed. That is, the data destruction component verifies that the data is corrupted. In some embodiments, the data destruction component verifies that data is corrupted based on a count of logical high bits in data read from a memory block after a data destruction operation has been performed. For example, the data destruction component can verify the data is corrupted based on there being no logical high bits in the data. In some embodiments, the data destruction component verifies that the data is corrupted by performing an Error Code Correction (ECC) check on data read from a memory block after a data destruction operation has been performed. For example, the data destruction component can verify the data is corrupted based on a threshold number of memory cells in a failing block failing the ECC check.

Destroying data on a failing block that cannot be erased, as described herein, enhances security of memory devices by ensuring that the data cannot be recovered. Further, the destruction of data and verification of the destruction improves upon typical handling of failing blocks, in which the failed erase status is ostensibly ignored, and the data is assumed unrecoverable, despite the fact that the data may still be recovered.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UPS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system. 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (AMC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operates in conjunction with memory sub-system controller 115 to execute operations on one or more memory cells of the memory devices 130.

The memory sub-system 110 also includes a data destruction component 113 that is responsible for destroying data stored on the memory devices 130 and 140 in response to an indication that the data was not successfully erased in response to an erase command. The data destruction component 113 can destroy data by applying a programming signal (e.g., a Vpgm pulse) to memory cells that cause the memory cells to store a voltage that exceeds a maximum readable threshold voltage, thereby corrupting the data stored by the memory cells. A typical erase status provided by one of the memory devices 130 or 140 indicates whether data on an entire block has been successfully erased, though the data destruction component may perform data destruction on a per cell, per page, per wordline, or per block basis. The data destruction component 113 is further responsible for verifying that data has been destroyed after performing a data destruction operation. The data destruction component 113 can verify that the data has been destroyed based on a count of logical high bits in data read from a memory block after a data destruction operation or based on the results of an ECC check performed on the memory block.

In some embodiments, the memory sub-system controller 115 includes at least a portion of the data destruction component 113. For example, the memory sub-system controller 115 can include a processor 117 (processing device) configured to execute instructions stored in local memory 119 for performing the operations described herein. In some embodiments, the data destruction component 113 is part of the host system 120, an application, or an operating system. In some embodiments, the local media controller 135 includes at least a portion of the data destruction component 113.

Figure 2:
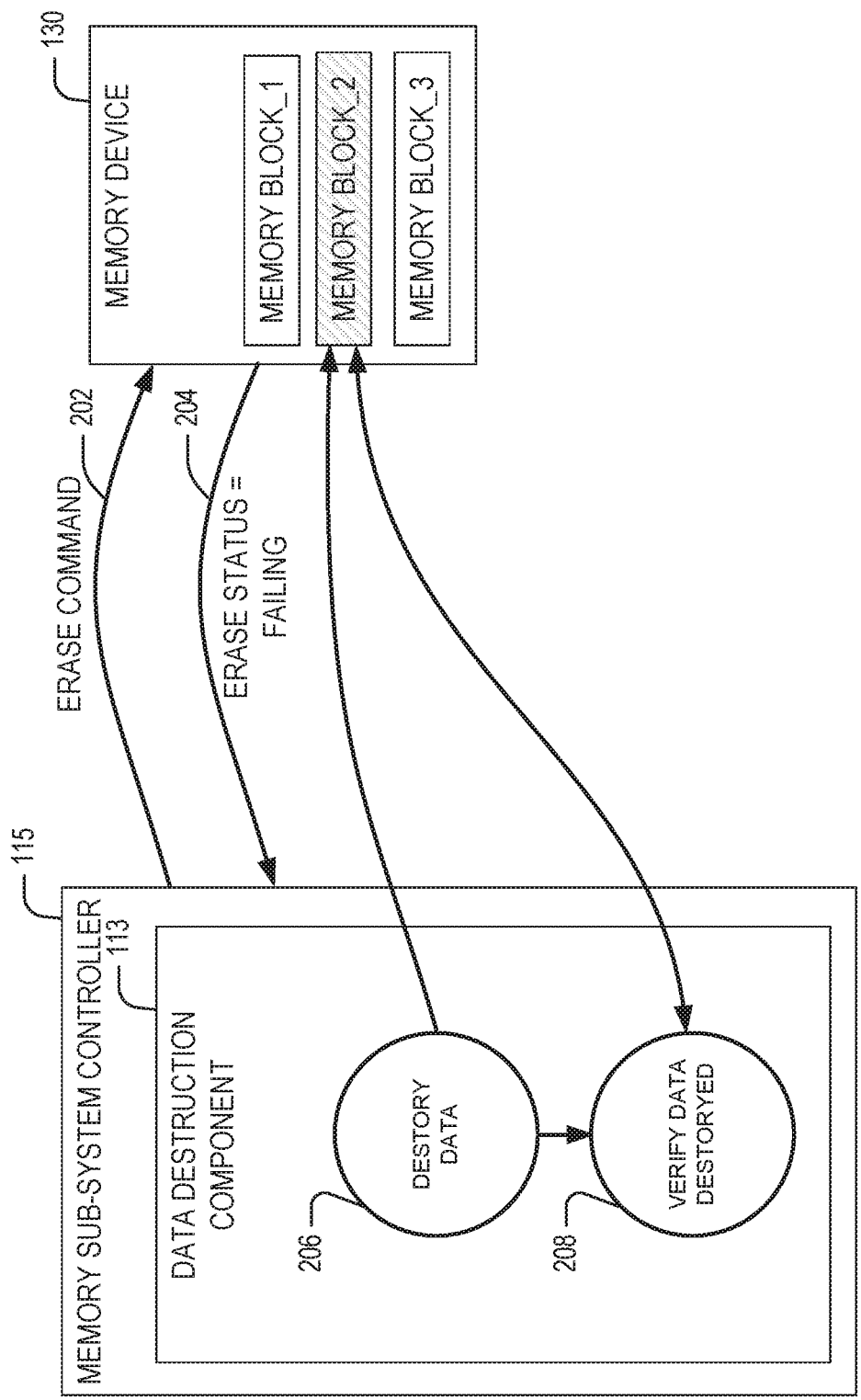
FIG. 2 is a data flow diagram illustrating interactions between components of the memory sub-system in destroying data on a memory device and verifying the data is destroyed, in accordance with some embodiments of the present disclosure.
Figure 3:
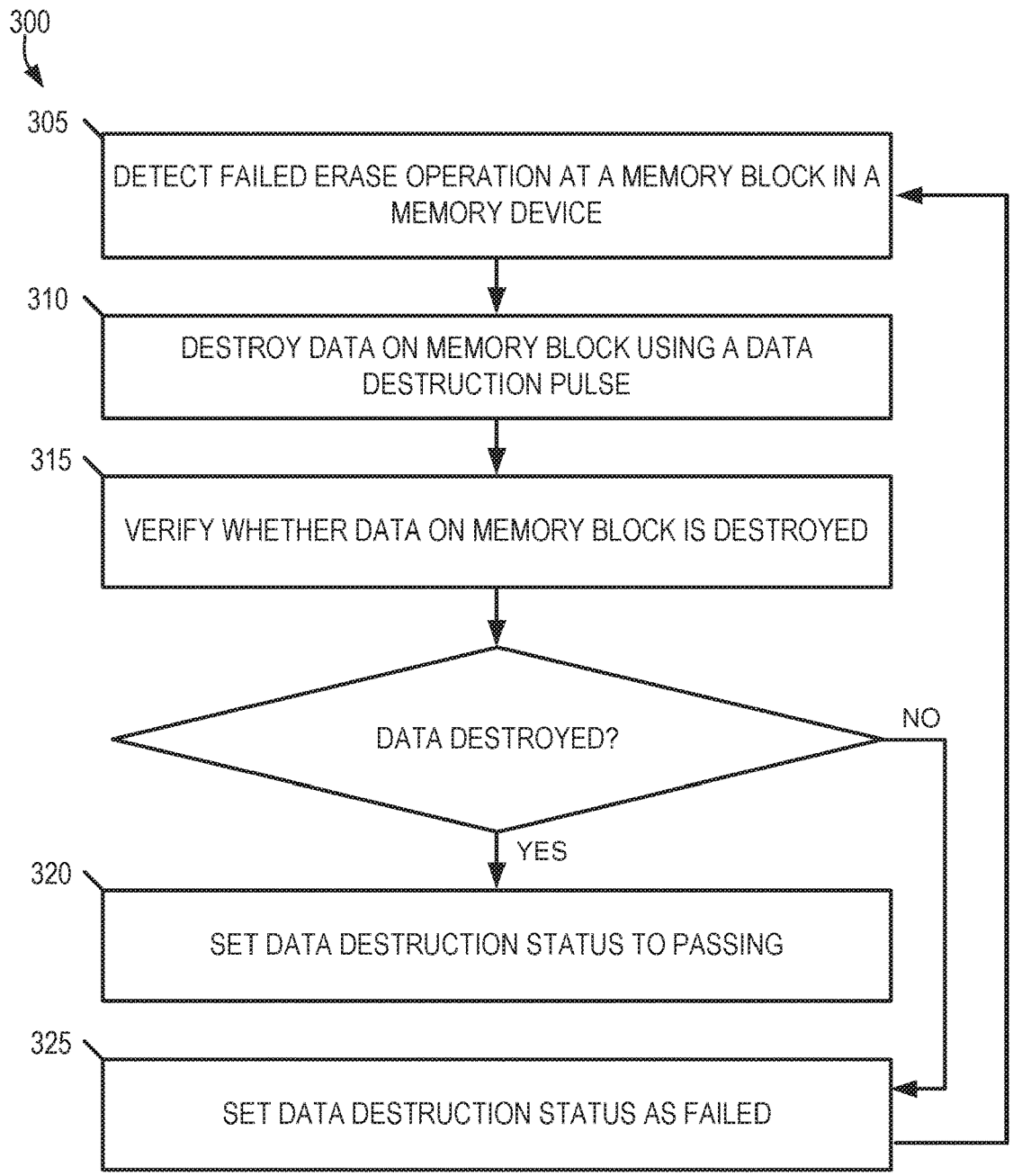
FIGS. 3-6 are flow diagrams illustrating an example method for data destruction and destruction verification on a memory device, in accordance with some embodiments of the present disclosure.

FIG. 2 is a data flow diagram illustrating interactions between components of the memory sub-system in destroying data on a memory device and verifying the data is destroyed, in accordance with some embodiments of the present disclosure. In the example illustrated in FIG. 2, the memory device 130 is a NAND memory device comprising multiple memory blocks: MEMORY BLOCK_1, MEMORY BLOCK_2, and MEMORY BLOCK_3. A NAND block comprises a 2D or 3D array comprising pages (rows) and strings (columns). Each cell includes a transistor and within each cell, data is stored as the threshold voltage of the transistor, based on the logical value of the cell (e.g., 0 or 1). During a read operation, a read reference voltage is applied to the transistor, and if the read reference voltage is higher than the threshold voltage of the cell, the transistor is programmed and is recognized by a memory sub-system as a binary value of 0. If the read reference voltage is lower than the threshold voltage of the cell, the transistor is recognized as a binary value of 1.

In a NAND memory block, individual strings are connected to allow storage and retrieval of data from selected cells. Strings in the block are connected at one end to a common source line and at the other end to a bit line. Each string also contains two control mechanisms in series with the memory cells. String and ground select transistors are connected to the string select line and ground select line. Memory cells in NAND memory devices are connected horizontally at their control gates to a word line to form a page. A page is a set of connected memory cells that share the same word line and are the minimum unit to program.

At 202, the memory sub-system controller sends an erase command to the memory device 130 to erase the memory blocks in series. In this example, the Host System 120 issues a NVMe Format Command to the memory sub-system 110 via a NVMe interface to erase data. The memory sub-system controller 115 responds to the NVMe Format Command by issuing an erase command to the memory device 130 via an ONFI interface to erase data on MEMORY BLOCK_1, MEMORY BLOCK_2, and MEMORY BLOCK_3 in series. The erase command initiates an erase process at the memory device 130 (e.g., an erase algorithm executed by the local media controller 135) to erase data on one or more of the memory blocks of the memory device 130. As an example, the erase process includes programming memory cells of every page of a memory block using an erase pulse (a voltage signal) that causes threshold voltages of the memory cells to indicate a logical high value.

At 204, the memory device 130 returns an erase status that indicates whether data was successfully erased. In the example illustrated, the erase status indicates that data on MEMORY BLOCK_2 was not successfully erased. That is, the memory device 130 provides the memory sub-system controller 115 with an indication of a failed erase status associated with MEMORY BLOCK_2.

Based on the failed erase status, the data destruction component 113 destroys data on MEMORY BLOCK_2, at 206. In some embodiments, the data destruction component 113 destroys the data by corrupting the data using a pulse with a very high programming voltage relative to a typical voltage used to program and erase memory cells. For example, the voltage of the programming signal used to corrupt the data can be set such that memory cell voltage thresholds are raised above a maximum readable threshold voltage. Memory cells with voltage threshold values above the maximum readable threshold voltage are not recognized as a binary value and are therefore corrupted.

The MEMORY BLOCK_2 may include various types of pages and each page type may have a different maximum readable threshold voltage for memory cells. In some embodiments, the voltage of the data destruction pulse can be determined based on a comparison of the different maximum readable threshold voltages. For example, to corrupt data on the memory cells of the MEMORY BLOCK_2, the data destruction component 113 can use a programming signal that raises memory cell threshold voltages above the maximum readable threshold voltage of the lowest maximum readable threshold voltage of pages in the memory block.

In some embodiments, the data destruction component 113 can apply the programming signal to all memory cells on all pages in the MEMORY BLOCK_2 at once. In some instances, an extremely high voltage (e.g., 21 volts) can be used to move memory cell threshold voltages above a passthrough voltage to pinch off NAND strings leading to insufficient string current to perform a read, thereby making all data on all write lines appear programmed above the maximum readable threshold voltage. With all cells programmed above the maximum readable threshold voltage, all data on the MEMORY BLOCK_2 is corrupted and unrecoverable.

In some embodiments, the data destruction component 113 destroys data on a page by page basis rather than by applying the programming signal to all cells at once. Consistent with these embodiments, the data destruction component 113 issues a programming command to the memory device 130 to program a binary value of "0" in every memory cell in every lower page on the MEMORY BLOCK_2. The data destruction component 113 may again utilize a pulse with a very high voltage to raise memory cell threshold voltages above the maximum readable threshold voltage. A benefit of this technique is that once an indication that the data is programmed has been received, the page and all shared pages are verified to have corrupted data.

At 208, the data destruction component 113 verifies that the data on the MEMORY BLOCK_2 is destroyed. That is, the data destruction component 113 verifies that the data on the MEMORY BLOCK_2 is corrupted. Depending on the embodiment, the data destruction component 113 can verify the data is destroyed based on a count of logical high bits in data read from the MEMORY BLOCK_2 after the data destruction operation is performed, based on a result of an ECC check performed on data read from the MEMORY BLOCK_2, by verifying the threshold voltage of each memory cell is above a system set program verify voltage level, or various combinations thereof.

In some embodiments, the data destruction component 113 verifies data on every page of the MEMORY BLOCK_2 is destroyed. In some embodiments, the data destruction component 113 may select a subset of pages or wordlines in the MEMORY BLOCK_2 to verify for data destruction. By validating only a subset, the data destruction component 113 can significantly improve the timing of the data destruction validation operations. FIGS. 3-6 are flow diagrams illustrating an example method 300 for data destruction and destruction verification on a memory device (e.g., memory device 130), in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the data destruction component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device detects a failed erase operation at a memory block (hereinafter referred to the "target block") of a memory device (e.g., memory device 130). The processing device may detect the failed erase operation based on a failed erase status provided by the memory device in response to an erase command provided to the memory device. That is, a failed erase status is provided by the memory device in response to an erase command and indicates that data on the target block was not successfully erased. The indication can, for example, be provided to a status register read by the processing device.

At operation 310, the processing device destroys the data on the target block in response to detecting the failed erase operation. Consistent with some embodiments, the processing device destroys the data using a data destruction pulse that corrupts the data. The data destruction pulse is a very large (e.g., 21V) programming voltage (signal) applied to the control gate of memory cells (e.g., NAND cell) that programs the threshold voltage of the cells to exceed a maximum readable threshold voltage of the cell. Once the memory cells threshold voltage exceeds the maximum readable threshold voltage, no data can be read from the memory cells and thus the data is unrecoverable. In some embodiments, the processing device uses a modified erase command to apply the data destruction pulse to the target block and destroy data on all memory cells of the target block.

Consistent with some embodiments, the processing device can destroy data on the target block on a page by page basis by using a modified programming command to program memory cells in lower pages on the MEMORY BLOCK_2 to a logical low value (a binary value of '0'). The programming command can be modified to use the data destruction pulse to program memory cells such that threshold voltages exceed the maximum readable threshold voltage, thereby rendering data stored by the cells as unrecoverable.

In some embodiments, the processing device can destroy the data on the memory block upon detecting the failed erase status. In some embodiments, upon detecting the failed erase status, the processing device can add the memory block to a data destruction queue and the processing device may destroy data on memory blocks in the data destruction queue at a later time, such as after attempts to erase other memory blocks of the memory device have been made. Thus, it shall be appreciated that although the processing device may destroy data in response to a failed erase status provided responsive to an erase command, the destruction of data can occur at any time based on the failed erase status.

At operation 315, the processing device verifies whether the data on the memory block is destroyed. The processing device verifies whether the data on the memory block is destroyed based on whether the data is determined to be corrupted. Depending on the embodiment, the processing device can verify the data is destroyed based on a count of logical high bits in data read from the target block, based on a result of an ECC check performed on cells of the target block, by verifying the threshold voltage of each memory cell is above a threshold voltage (e.g., a system set program verify voltage level), or various combinations thereof. In some embodiments, the processing device may utilize a programming verification algorithm to verify that all memory cells are programmed with a passing status.

In some embodiments, the processing device verifies data on every page of the target block is destroyed, while in other embodiments, the processing device selects only a subset of pages or write lines in the target block to verify for data destruction to increase the speed of the data destruction validation operation. Further details regarding the verification of data destructions are discussed below in reference to FIGS. 5 and 6.

If the processing device determines that the data was successfully destroyed, the processing device sets a data destruction status of the target block to passing, at operation 320. The processing device can set the status using a status register. For example, the processing device can program one or more bits in a status register to indicate the passing data destruction status of the memory block. The status register can be read by one or more components of the memory sub-system 110. If the processing device determines that the data was not successfully destroyed, the method 300 proceeds to operation 325 where the processing device sets the data destruction status to failing. To set the data destruction to failing, the processing device can program one or more bits in the status register referenced above.

After setting the data destruction status to failing, the processing device may return to operation 305 and repeat the method 300 for the target block until data destruction can be verified. It shall be appreciated that although the method 300 is described in reference to a single memory block of the memory device, the method 300 may be repeated for each memory block with a failed erase status in the memory device.

Figure 4:
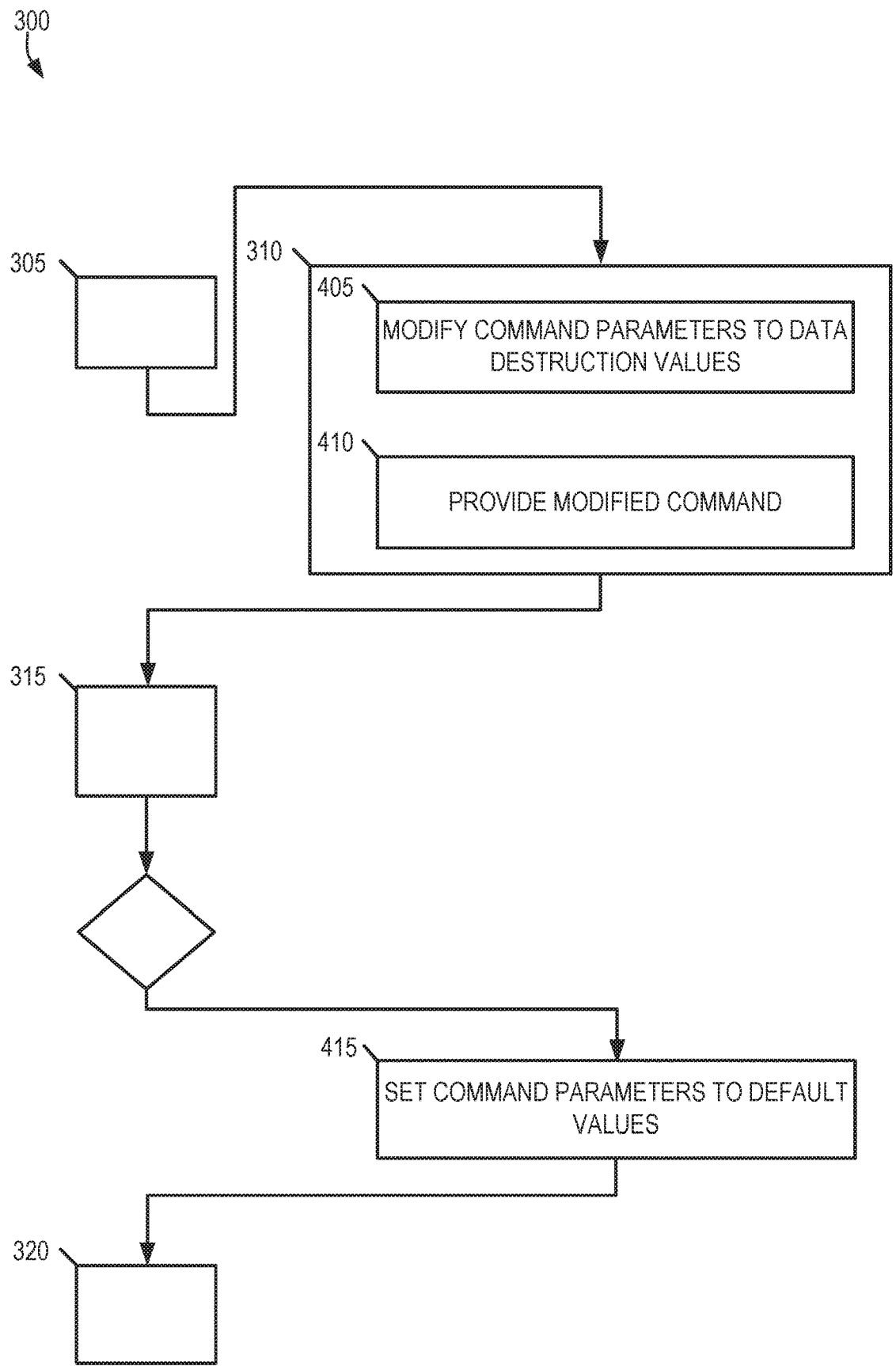

As shown in FIG. 4, the method 300 may, in some embodiments, comprise operations 405, 410, and 415. Consistent with these embodiments, the operations 405 and 410 may be performed as part of operation 310 where the processing device destroys the data on the memory block. At operation 405, the processing device modifies one or more command parameters to include data destruction values. That is, the processing device replaces default values for one or more command parameters to values used in destroying data. In some embodiments, the command parameters are erase command parameters corresponding to an erase command normally used to erase data from a memory block. In some embodiments, the command parameters are program command parameters corresponding to a program command used to program data on a memory block.

In modifying the command parameters, the processing device increases an intensity of a signal (an erase pulse or a program pulse) used to erase or program the memory block. In some embodiments, the processing device increases a voltage level of an erase pulse used to erase data from the memory block. In some embodiments, the processing device increases a voltage level of a program pulse used to program data on the memory block. The data destruction pulse may comprise a modified erase pulse or a modified program pulse.

In an example, in embodiments in which the memory device is a NAND memory device, the processing device can modify trim settings associated with the memory device to include data destruction values.

At operation 410, the processing device provides a modified command to the memory device based on the modified command parameters. The processing device can provide the command via ONFI interface. The modified command can correspond to a modified erase command or a modified program command. Providing the modified command to the memory device causes memory cells of the memory block to be programmed using the data destruction pulse, which results in the threshold voltages of the memory cells exceeding the maximum readable threshold voltage, thereby corrupting data stored by the memory block. In embodiments in which the modified erase command is used, the data destruction pulse is applied to all memory cells of the memory block. In embodiments in which the modified programming command is used, data destruction pulse is applied to memory cells on a page by page basis.

Consistent with these embodiments, the operation 415 may be performed subsequent to operation 315 where the processing device verifies that the data is destroyed. At operation 415, the processing device sets the command parameters back to default values used in typical erase commands. In some embodiments, the operation 415 may be performed in response to determining that there are no remaining memory blocks on the memory device with a failed erase status. That is, the processing device may iteratively destroy data on all failing memory blocks using the modified command parameters, and once all data has been destroyed, the processing device returns the command parameters to default values.

Figure 5:
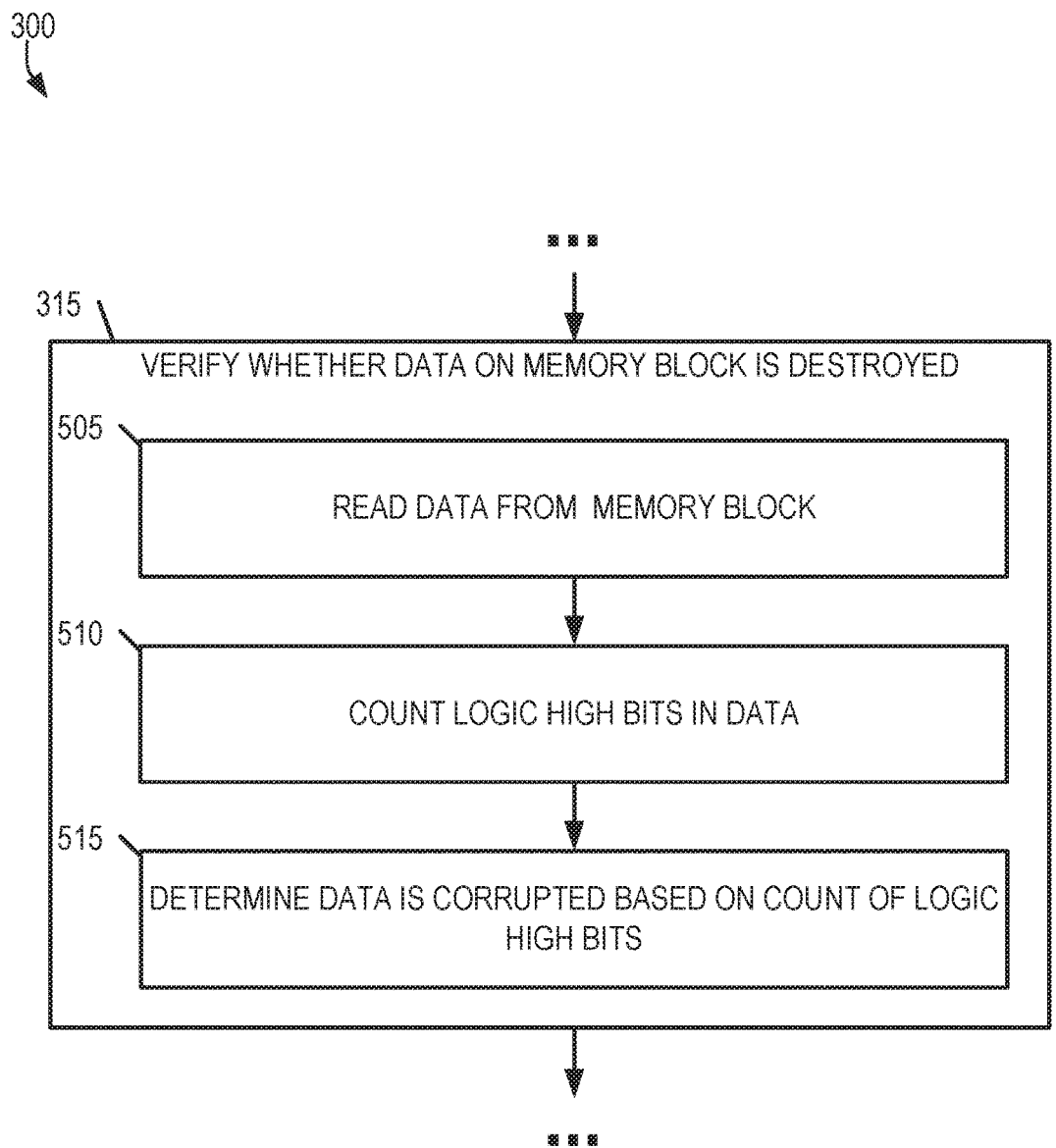

As shown in FIG. 5, the method 300 may, in some embodiments, include operation 505, 510, and 515. Consistent with these embodiments, the operations 505, 510, and 515 can be performed as part of the operation 315 where the processing device verifies whether the data on the memory block is destroyed.

At operation 505, the processing device reads data from the memory block. The processing device counts the number of logical high bits or the number of logical low bits in the data, at operation 510. That is, the processing device counts the number of 1s or 0s in the data read from the memory block.

At operation 515, the processing device determines that the data on the memory block is corrupted based on the count of logical high or logical low bits in the data. The processing device may determine that the data is corrupted based on the count of logical high bits or logical low bits not exceeding a threshold number. In some embodiments, the threshold number is zero. Thus, consistent with this embodiment, the processing device may determine that the data is corrupted based on there being no binary values of 1 in the data read from the memory block or conversely, the processing device may determine that the data is corrupted based on there being no binary values of 0 in the data.

In some embodiments, the processing device may perform one or more data manipulations (e.g. invert data in the page buffers) and use internal counters to compare the count of 1's or 0's with a predetermined threshold to verify that the data is corrupted.

Figure 6:
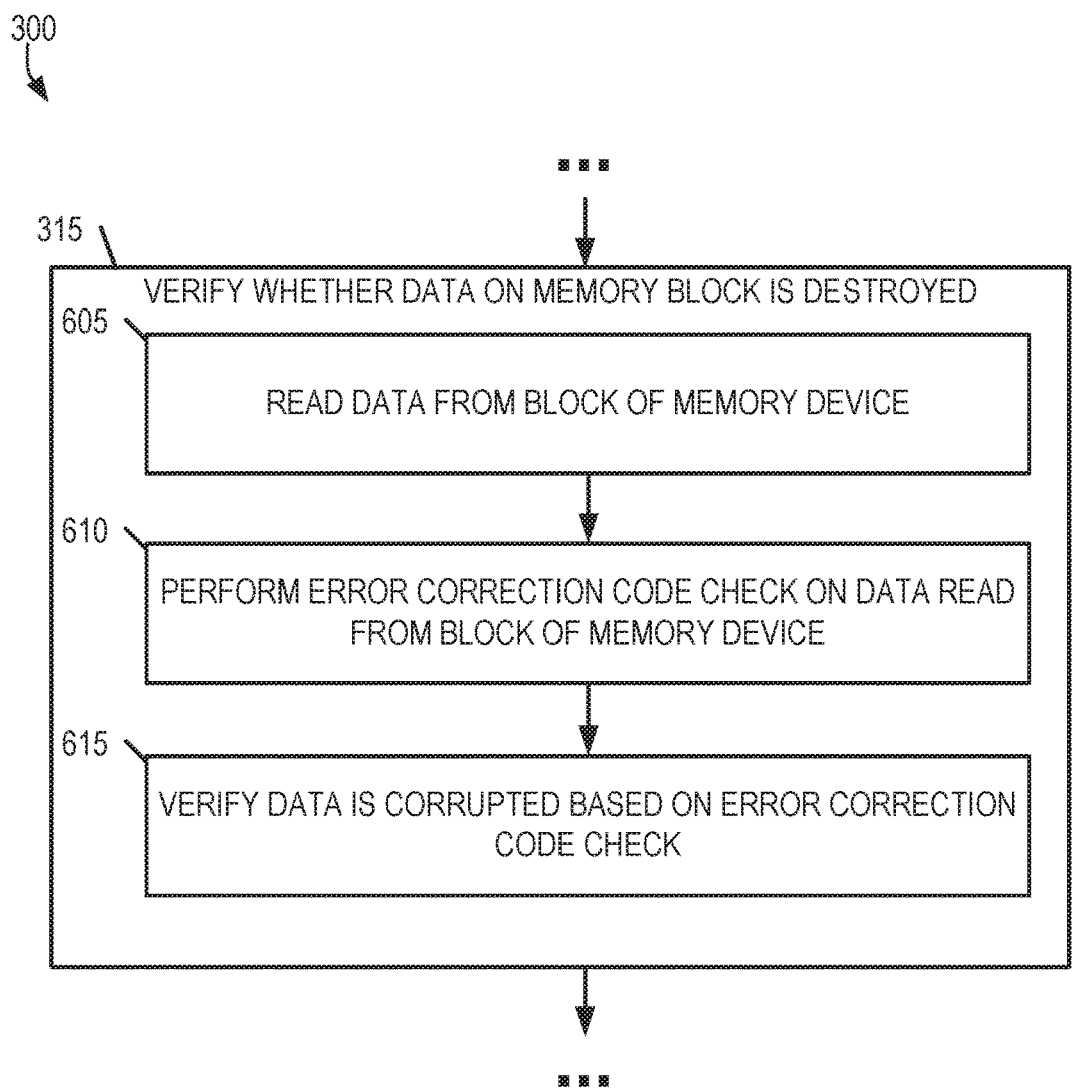

As shown in FIG. 6, the method 300 may, in some embodiments, include operation 605, 610, and 615. Consistent with these embodiments, the operations 605, 610, and 615 can be performed as part of the operation 315 where the processing device verifies whether the data on the memory block is destroyed.

At operation 605, the processing device reads data from the memory block of the memory device and performs ECC check on the data, at operation 610. The processing device verifies that the data is corrupted based on a result of the ECC check. For example, the processing device can determine that the data is corrupted based on the number of pages in the memory block that fail the error code correction check. The processing device can determine that the data is corrupted based on the number of pages in the memory block exceeding a predetermined threshold number.

EXAMPLES

Example 1 is a memory sub-system comprising: a memory device; and a processing device, operatively coupled with the memory device, to perform operations comprising: detecting a failed erase operation at a memory block of the memory device; based on detecting the failed erase operation at the memory block, destroying data on the memory block using a data destruction pulse that corrupts the data on the memory block; verifying the data on the memory block is destroyed; and providing a passing data destruction status for the memory block based on verifying the data on the memory block is destroyed.

Example 2 includes the memory sub-system of Example 1, wherein the detecting of the failed erase operation is based on a failed erase status provided by the memory device.

Example 3 includes the memory sub-system of any one or more of Examples 1 and 2 wherein the data destruction pulse causes threshold voltages of one or more memory cells in the memory block to exceed a maximum readable threshold voltage.

Example 4 includes the memory sub-system of any one or more of Examples 1-3 wherein the destroying of the data on the memory block comprises: modifying an erase command parameter using a data destruction value; and providing a modified erase command to the memory device based on the modified erase command parameter, wherein the data destruction pulse is applied to one or more memory cells in the memory block based on providing the modified erase command to the memory device.

Example 5 includes the memory sub-system of any one or more of Examples 1-4, wherein the modifying the erase command parameter comprises increasing a voltage level of an erase pulse, the increasing of the voltage level resulting in the data destruction pulse.

Example 6 includes the memory sub-system of any one or more of Examples 1-5, wherein the operations further comprise setting the erase command parameter to a default value based on verifying the data on the memory block is destroyed.

Example 7 includes the memory sub-system of any one or more of Examples 1-6, wherein the destroying of the data on the memory block comprises: modifying a program command parameter using a data destruction value; and providing a modified program command to the memory device based on the modified program command parameters, wherein the data destruction pulse is applied to one or more memory cells in the memory block based on providing the modified program command to the memory device.

Example 8 includes the memory sub-system of any one or more of Examples 1-7, wherein the modifying of the program command parameters comprises increasing a voltage level of a program pulse used to program memory cells of the memory block, the increasing of the voltage level resulting the data destruction pulse.

Example 9 includes the memory sub-system of any one or more of Examples 1-8, wherein verifying the data on the memory block is destroyed comprises verifying that the data on the memory block is corrupted.

Example 10 includes the memory sub-system of any one or more of Examples 1-9, wherein verifying the data on the memory block is destroyed comprises: reading the data from the memory block; determining a count of logical high bits in the data; and determining the data is corrupted based on the count of logical high or logical low bits.

Example 11 includes the memory sub-system of any one or more of Examples 1-10, wherein verifying the data on the memory block is destroyed comprises: reading the data from the memory block; performing an error code correction check on the data; and verifying the data is corrupted based on a result of the error code correction check.

Example 12 includes the memory sub-system of any one or more of Examples 1-11, wherein the verifying the data is corrupted is based on a number of pages in the memory block that fail the error code correction check.

Example 13 is a method comprising: detecting a failed erase operation at a memory block of a memory device; based on detecting the failed erase operation at the memory block, destroying data on the memory block using a data destruction pulse that corrupts the data on the memory block; verifying the data on the memory block is destroyed; and providing a passing data destruction status for the memory block based on verifying the data on the memory block is destroyed.

Example 14 includes the method of Example 13, wherein the data destruction pulse causes threshold voltages of one or more memory cells in the memory block to exceed a maximum readable threshold voltage.

Example 15 includes the method of any one or more of Examples 13 or 14, wherein the destroying of the data on the memory block comprises: modifying an erase command parameter using a data destruction value, the modifying the erase command parameter comprising increasing a voltage level of an erase pulse; and providing a modified erase command to the memory device based on the modified erase command parameter, wherein the data destruction pulse is applied to one or more memory cells in the memory block based on providing the modified erase command to the memory device.

Example 16 includes the method of any one or more of Examples 13-15, wherein the destroying of the data on the memory block comprises: modifying a program command parameter using a data destruction value, wherein the modifying of the program command parameters comprises increasing a voltage level of a program pulse used to program memory cells of the memory block; and providing a modified program command to the memory device based on the modified program command parameters, wherein the data destruction pulse is applied to one or more memory cells in the memory block based on providing the modified program command to the memory device.

Example 17 includes the method of any one or more of Examples 13-16, wherein verifying the data on the memory block is destroyed comprises verifying that the data on the memory block is corrupted.

Example 18 includes the method of any one or more of Examples 13-17, wherein verifying the data on the memory block is destroyed comprises: reading the data from the memory block; determining a count of logical high or logical low bits in the data; and determining the data is corrupted based on the count of logical high or logical low bits.

Example 19 includes the method of any one or more of Examples 13-18, wherein verifying the data on the memory block is destroyed comprises: reading the data from the memory block; performing an error code correction check on the data; and verifying the data is corrupted based on a result of the error code correction check.

Example 20 is a non-transitory computer-readable storage medium comprising instructions that, when executed by a processing device, configure the processing device to perform operations comprising: detecting a failed erase operation at a memory block of the memory device; based on detecting the failed erase operation at the memory block, destroying data on the memory block using a data destruction pulse that corrupts the data on the memory block; verifying the data on the memory block is destroyed; and providing a passing data destruction status for the memory block based on verifying the data on the memory block is destroyed.

Figure 7:
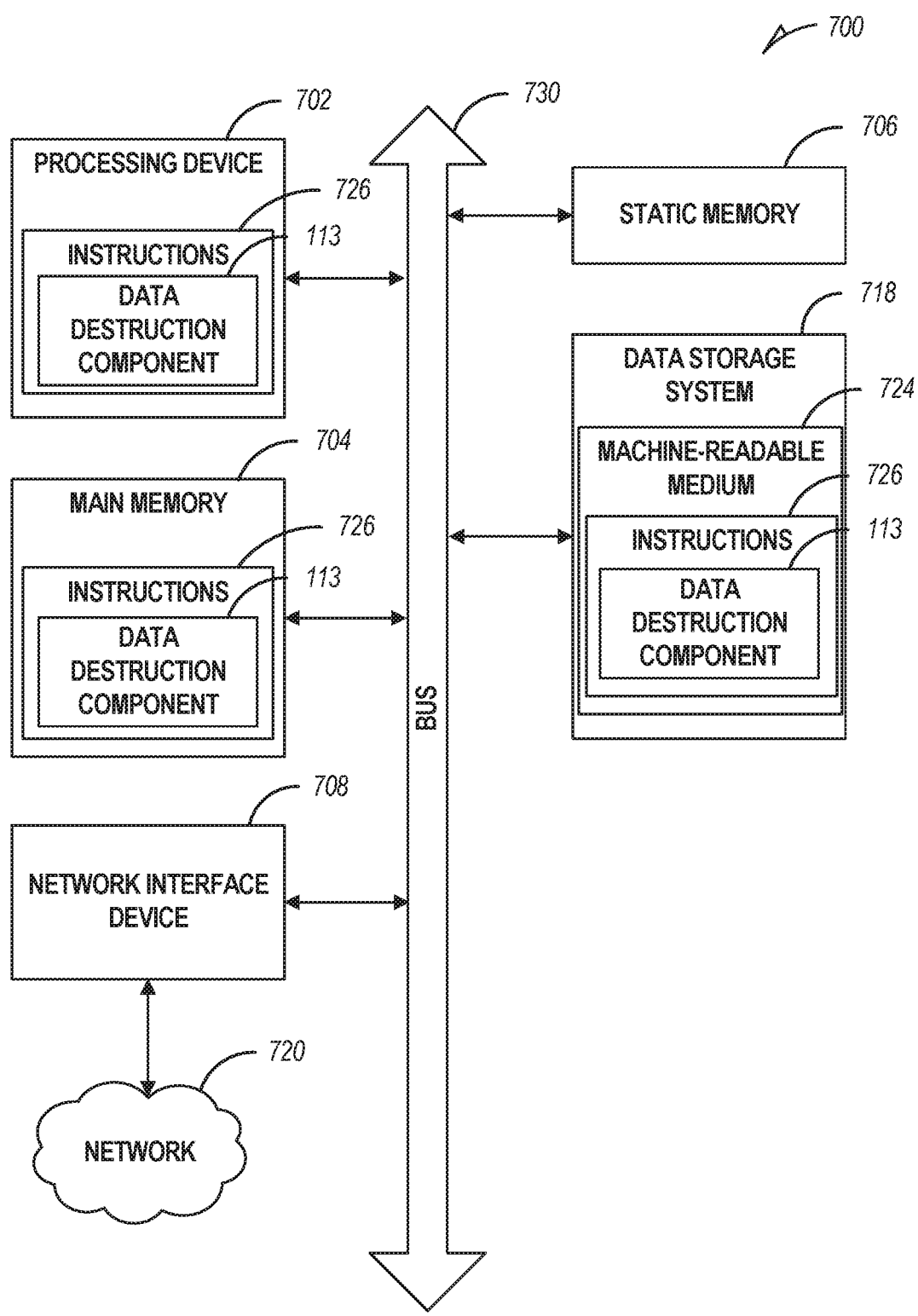
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data destruction component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., ROM, flash memory, DRAM such as SDRAM or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an ASIC, a FPGA, a digital signal processor (DSP), network processor, or the like. The processing device 702 is configured to execute instructions 726 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a data destruction component (e.g., the data destruction component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A memory sub-system comprising:
    a memory device;
    a local memory component storing a set of instructions; and
    a processing device, operatively coupled with the memory device and the local memory component, to execute the set of instructions stored in the local memory component, the set of instructions, when executed by the processing device, configuring the processing device to perform operations comprising:
        detecting a failed erase operation at a memory block of the memory device;
        based on detecting the failed erase operation at the memory block, destroying data on the memory block using a data destruction pulse that corrupts the data on the memory block;
        verifying the data on the memory block is destroyed based on at least one of: a count of logical high bits in the data, and an error code correction check on the data; and
        providing a passing data destruction status for the memory block based on verifying the data on the memory block is destroyed.

2. The memory sub-system of claim 1, wherein the detecting of the failed erase operation is based on a failed erase status provided by the memory device.

3. The memory sub-system of claim 1, wherein the data destruction pulse causes threshold voltages of one or more memory cells in the memory block to exceed a maximum readable threshold voltage.

4. The memory sub-system of claim 1, wherein the destroying of the data on the memory block comprises:
    modifying an erase command parameter using a data destruction value; and
    providing a modified erase command to the memory device based on the modified erase command parameter, wherein the data destruction pulse is applied to one or more memory cells in the memory block based on providing the modified erase command to the memory device.

5. The memory sub-system of claim 4, wherein the modifying the erase command parameter comprises increasing a voltage level of an erase pulse, the increasing of the voltage level resulting in the data destruction pulse.

6. The memory sub-system of claim 4, wherein the operations further comprise setting the erase command parameter to a default value based on verifying the data on the memory block is destroyed.

7. The memory sub-system of claim 1, wherein the destroying of the data on the memory block comprises:
    modifying a program command parameter using a data destruction value; and
    providing a modified program command to the memory device based on the modified program command parameters, wherein the data destruction pulse is applied to one or more memory cells in the memory block based on providing the modified program command to the memory device.

8. The memory sub-system of claim 7, wherein the modifying of the program command parameters comprises increasing a voltage level of a program pulse used to program memory cells of the memory block, the increasing of the voltage level resulting the data destruction pulse.

9. The memory sub-system of claim 1, wherein verifying the data on the memory block is destroyed comprises verifying that the data on the memory block is corrupted.

10. The memory sub-system of claim 1, wherein verifying the data on the memory block is destroyed comprises:
    reading the data from the memory block;
    determining the count of logical high bits in the data; and
    determining the data is corrupted based on the count of logical high bits.

11. The memory sub-system of claim 1, wherein verifying the data on the memory block is destroyed comprises:
    reading the data from the memory block;
    performing the error code correction check on the data; and
    verifying the data is corrupted based on a result of the error code correction check.

12. The memory sub-system of claim 11, wherein the verifying the data is corrupted is based on a number of pages in the memory block that fail the error code correction check.

13. A method comprising:
detecting a failed erase operation at a memory block of a memory device;
based on detecting the failed erase operation at the memory block, destroying data on the memory block using a data destruction pulse that corrupts the data on the memory block;
verifying the data on the memory block is destroyed based on at least one of: a count of logical high bits in the data, and an error code correction check on the data; and
providing a passing data destruction status for the memory block based on verifying the data on the memory block is destroyed.

14. The method of claim 13, wherein the data destruction pulse causes threshold voltages of one or more memory cells in the memory block to exceed a maximum readable threshold voltage.

15. The method of claim 13, wherein the destroying of the data on the memory block comprises:
modifying an erase command parameter using a data destruction value, the modifying the erase command parameter comprising increasing a voltage level of an erase pulse; and
providing a modified erase command to the memory device based on the modified erase command parameter, wherein the data destruction pulse is applied to one or more memory cells in the memory block based on providing the modified erase command to the memory device.

16. The method of claim 13, wherein the destroying of the data on the memory block comprises:
modifying a program command parameter using a data destruction value, wherein the modifying of the program command parameters comprises increasing a voltage level of a program pulse used to program memory cells of the memory block; and
providing a modified program command to the memory device based on the modified program command parameters, wherein the data destruction pulse is applied to one or more memory cells in the memory block based on providing the modified program command to the memory device.

17. The method of claim 13, wherein verifying the data on the memory block is destroyed comprises verifying that the data on the memory block is corrupted.

18. The method of claim 13, wherein verifying the data on the memory block is destroyed comprises:
reading the data from the memory block;
determining the count of logical high bits in the data; and
determining the data is corrupted based on the count of logical high bits.

19. The method of claim 13, wherein verifying the data on the memory block is destroyed comprises:
reading the data from the memory block;
performing the error code correction check on the data; and
verifying the data is corrupted based on a result of the error code correction check.

20. A non-transitory computer-readable storage medium comprising instructions that, when executed by a processing device, configure the processing device to perform operations comprising:
detecting a failed erase operation at a memory block of a memory device;
based on detecting the failed erase operation at the memory block, destroying data on the memory block using a data destruction pulse that corrupts the data on the memory block;
verifying the data on the memory block is destroyed based on at least one of: a count of logical high bits in the data, and an error code correction check on the data; and
providing a passing data destruction status for the memory block based on verifying the data on the memory block is destroyed.

* * * * *